(12) United States Patent
Oishi et al.

(10) Patent No.: US 7,035,759 B2
(45) Date of Patent: Apr. 25, 2006

(54) POSITION DETECTING METHOD AND APPARATUS

(75) Inventors: Satoru Oishi, Tochigi (JP); Takehiko Suzuki, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/669,285

(22) Filed: Sep. 24, 2003

(65) Prior Publication Data

US 2004/0059541 A1    Mar. 25, 2004

(30) Foreign Application Priority Data

Sep. 24, 2002  (JP)  ............................. 2002-277495

(51) Int. Cl.
*G01C 15/00*  (2006.01)
(52) U.S. Cl. ..................................... 702/150
(58) Field of Classification Search ................ 702/150; 250/548; 355/55, 53, 72, 30; 359/708, 224; 382/149, 151; 430/313, 311; 324/754; 356/400, 356/237; 438/689; 451/5
See application file for complete search history.

(56) References Cited

U.S. PATENT DOCUMENTS

| | | | | |
|---|---|---|---|---|
| 6,081,614 A | * | 6/2000 | Yamada et al. | ............. 382/151 |
| 2001/0049589 A1 | * | 12/2001 | Yasuda et al. | ............. 702/150 |
| 2002/0113218 A1 | * | 8/2002 | Okumura et al. | ........... 250/548 |
| 2003/0007677 A1 | * | 1/2003 | Hiroi et al. | ................. 382/149 |

* cited by examiner

*Primary Examiner*—Bryan Bui
*Assistant Examiner*—Tung S. Lau
(74) *Attorney, Agent, or Firm*—Morgan & Finnegan, L.L.P.

(57) ABSTRACT

A position detecting method includes the steps of forming an image of a mark on a sensor, performing a first process that processes a raw signal obtained from the sensor with plural parameters, performing a second process that determines an edge of a signal processed by the first process for each parameter, determining a parameter from a result of the second process obtained for each parameter, and calculating a position of the mark based on a determined parameter.

1 Claim, 11 Drawing Sheets

POSITION DETECTING METHOD AND APPARATUS

This application claims a benefit of priority based on Japanese Patent Application No. 2002-277495, filed on Sep. 24, 2002, which is hereby incorporated by reference herein in its entirety as if fully set forth herein.

BACKGROUND OF THE INVENTION

The present invention relates to a position detecting method suitable for alignment between a reticle and a wafer for use with an exposure apparatus that exposes an object, such as a single crystal substrate for a semiconductor wafer, and a glass plate for a liquid crystal display ("LCD").

Projection exposure apparatuses used to manufacture semiconductor devices, such as ICs, LSIs, and VLSIs, have been required to expose a circuit pattern on a reticle onto a wafer with high resolution along with demands for finer and higher density circuits. The projection resolving power of a circuit pattern depends upon a numerical aperture ("NA") of a projection optical system and a wavelength of exposure light, and methods to achieve high resolution include a method to increase an NA of a projection optical system and a method to use exposure light having a shorter wavelength. Regarding the latter method, an exposure light source has shifted from g-line to i-line and from i-line to the excimer laser. Exposure apparatuses that use the excimer laser having an oscillation wavelength of 248 nm and 193 nm have already been reduced to practice.

At present, those exposure methods have been currently studied for the next generation, which use a vacuum ultraviolet ("VUV") exposure method that uses exposure light having a wavelength of 157 nm and an extreme ultraviolet ("EUV") exposure method that uses exposure light having a wavelength of around 13 nm.

Manufacture processes of semiconductor devices are diversified, and the planation technology for solving a problematically small depth of focus in an exposure apparatus have called attention, such as a Tungsten Chemical Mechanical Polishing ("W-CMP") process, Cu dual damocene wiring technology, and technology that applies a low dielectric constant ("Low-k") material to an interlayer dielectric. There have been proposed a wide variety of structures and materials for semiconductor devices, for example, Pseudomorphic High Electron Mobility Transistor ("P-HEMT") and Metamorphe-HEMT ("M-HEMT") made of compound such as GaAs and InP, Heterojunction Bipolar Transistors ("HBTs") that use SiGe, SiGeC, etc.

On the other hand, fine circuit patterns have required a precise alignment between a reticle (mask) that forms a circuit pattern and a wafer to which the circuit pattern is projected; the necessary precision is about ⅓ of a circuit critical dimension, e.g., 60 nm that is ⅓ as long as the current design width of 180 nm.

Alignment in an exposure apparatus usually images an optical image of an alignment mark formed on a wafer, onto an image pickup device, such as a CCD camera, and image-processes an electric signal to detect a position of the mark on the wafer.

In general, a non-uniform film thickness of resist near the alignment mark and an asymmetric shape of the alignment mark are influential factors that deteriorate alignment accuracy on the wafer upon alignment between the reticle and wafer. These alignment error factors caused by the wafer are referred to as wafer induced shift ("WIS").

It is a vital issue to improve the overlay accuracy for actual wafer device as one of three factors in an exposure apparatus for improved performance of semiconductor devices and manufacture yield. However, an introduction of special semiconductor manufacturing technology, such as a CMP process, has problematically generated defects in alignment marks although a circuit pattern has a good structure. This is caused by a large difference in critical dimension between a circuit pattern and an alignment mark along with a fine circuit pattern. In other words, it appears that this problem occurs since process conditions, such as a film formation, etching, and CMP, are optimized for a fine circuit pattern (with a critical dimension from 0.1 to 0.5 μm) but not for a large alignment mark (with a critical dimension from 0.6 to 4.0 μm).

When a critical dimension of an alignment mark is attempted to fit that of a circuit pattern, a microscope used for the alignment comes to have insufficient resolution, and signal intensity or contrast reduces, deteriorating stability of a detected signal of an alignment mark. A detection optical system that may detect an alignment mark that has a critical dimension equivalent to that of the circuit pattern requires a high NA and a light source having a short wavelength for alignment, i.e., an optical system having performance as high as that of a projection optical system for transferring a circuit pattern, generating another problem of increased apparatus cost.

At present, when this problem occurs, a process condition is changed by trial and error, for example, by resetting the condition suitable for both the alignment mark and circuit pattern, or by manufacturing plural types of alignment marks having different critical dimensions, by evaluating the exposure results, and by using such an alignment mark as has the best critical dimension.

Therefore, it takes a long time to determine the best condition or parameters. In addition, even after parameters are determined, the parameters should be changed ,when a wafer process error WIS occurs for an exposure apparatus along with a changing manufacture process. This also requires a long time. In addition, it is expected in the future that it will be increasingly difficult to manufacture both a circuit pattern and an alignment mark on a whole wafer surface without defect due to more demands of finer circuit patterns, an introduction of new semiconductor processes, and a large wafer diameter up to 300 mm.

FIG. 5 shows a conventional exemplary detected signal of an alignment mark. As shown in FIG. 5A, an approach has been generally known which detects edges of a mark so as to detect a mark position from a raw signal as a result of detections of plural alignment marks (or mark raw signal).

The edge detection is an approach for calculating a maximum or minimum position of primary differentiation to the mark raw signal shown in FIG. 5A, but this approach is subject to influence of high-frequency noises when a raw signal from a sensor is primarily differentiated. Accordingly, some pretreatment or filtering is needed. More specifically, as shown in FIG. 5C, for example, it is conceivable to carry out the primary differentiation after a zero phase filtering. Here, the "zero phase filtering" is defined as a process to invert and re-filter a data string filtered according to forward filtering. Therefore, the data string obtained from the zero phase filtering has a phase distortion of strictly zero, providing permanent phase information shown in FIG. 5 in an abscissa axis on a paper surface.

There is no definite criterion to determine how much parameter or order the zero phase filtering has. Under the present conditions, the best parameter or order is determined, for example, by using a method of comparing a mark raw signal with a filtered signal at a waveform level and minimizing a sum of squares in a residual error, a method of comparing these frequency characteristics and confirming whether the high-frequency noise component has been removed, etc.

When a mark raw signal includes an error due to influence of a wafer process error WIS, etc., the filtered signal includes a distortion component, whereby the WIS affects the edge detection, and finally a detection of a mark position.

BRIEF SUMMARY OF THE INVENTION

Accordingly, from the foregoing in mind, it is an exemplified object of the present invention to provide a position detecting method which may precisely and promptly execute alignment even when there is a wafer process error WIS due to a defect of an alignment mark, a non-uniform resist application, etc., by proposing a criterion necessary to determine a parameter for a pretreatment, such as filtering.

A position detecting method of one aspect according to the present invention includes the steps of forming an image of a mark on a sensor, performing a first process that processes a raw signal obtained from the sensor with plural parameters, performing a second process that determines an edge of a signal processed by the first process for each parameter, determining a parameter from a result of the second process obtained for each parameter, and calculating a position of the mark based on a determined parameter.

The first process may be zero phase filtering, and the parameters for the first process may include an order of a filter. The first process may be polynomial approximation, and the parameters for the first process may include an order of a polynomial. The mark may include plural elements arranged at a certain pitch based on a design value, and the step of determining the parameter may be based on a deviation of intervals between the elements from the design value calculated by using the result of the second process.

An exposure apparatus of another aspect according to the present invention includes a projection optical system that projects a pattern formed on a reticle onto a wafer, and a position detection system for detecting a position of a mark formed on the wafer, the positing detection system detecting the position of the mark using the above position detecting method.

A device fabrication method of still another aspect according to the present invention includes the step of applying resist onto an object to be exposed, projecting a pattern formed on a reticle onto the object using the above exposure apparatus, and developing the resist exposed. Claims for the device fabrication method that exhibits operations similar to those of the above exposure apparatus cover devices as their intermediate products and finished products. Moreover, such devices include semiconductor chips such as LSIs and VLSIs, CCDs, LCDs, magnetic sensors, thin-film magnetic heads, etc.

Other objects and further features of the present invention will become readily apparent from the following description of the embodiments with reference to accompanying drawings.

DETAILED DESCRIPTION OF THE PREFERRED EMBODIMENTS

A detailed description will now be given of the preferred embodiments according to the present invention, with reference to accompanying drawings.

Figure 1:
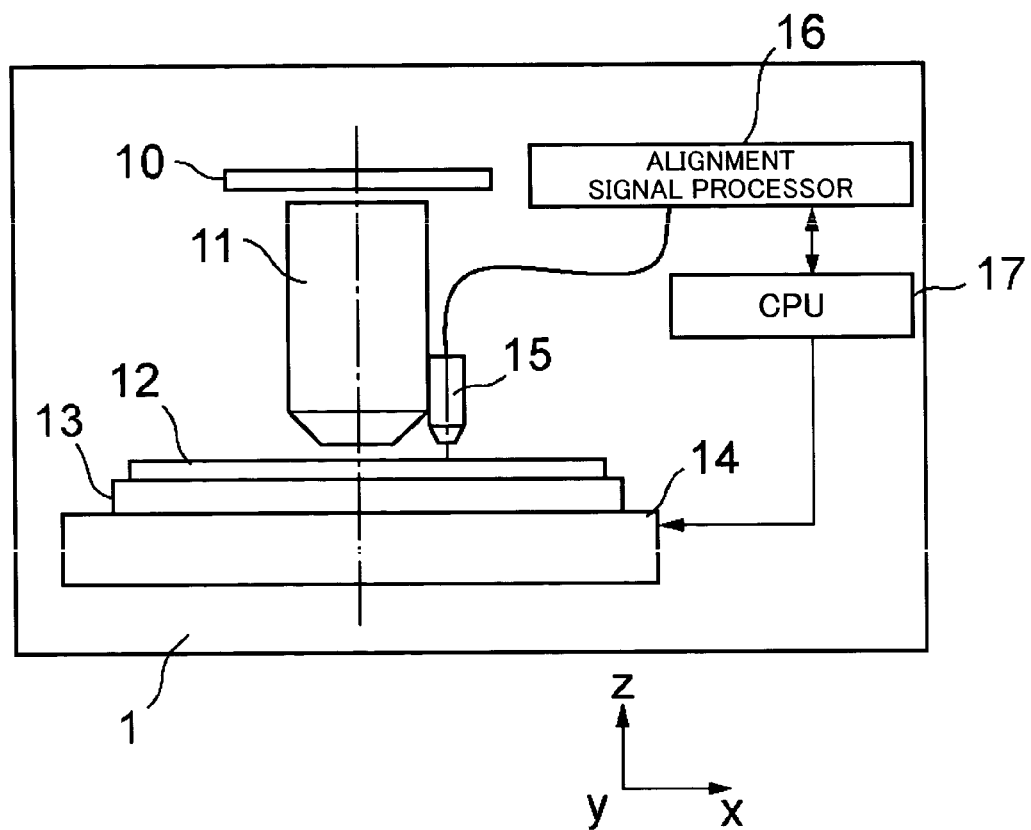
FIG. 1 is a schematic view of a semiconductor exposure apparatus of one embodiment.

FIG. 1 is a schematic view of principal parts of an exposure apparatus of an inventive semiconductor exposure apparatus. In FIG. 1, a semiconductor exposure apparatus 1 (referred to as "exposure apparatus 1" hereinafter) includes a reduction projection optical system 11 for projecting a reduced size of a reticle 10 that forms a certain circuit pattern, a wafer chuck 13 that holds a wafer 12 onto which a primary coat pattern and alignment marks have been formed in a pretreatment step, a wafer stage 14 that positions the wafer 12 at a predetermined position or an alignment position, an alignment detection optical system 15 that measures a position of the alignment mark on the wafer, etc.

Figure 2:
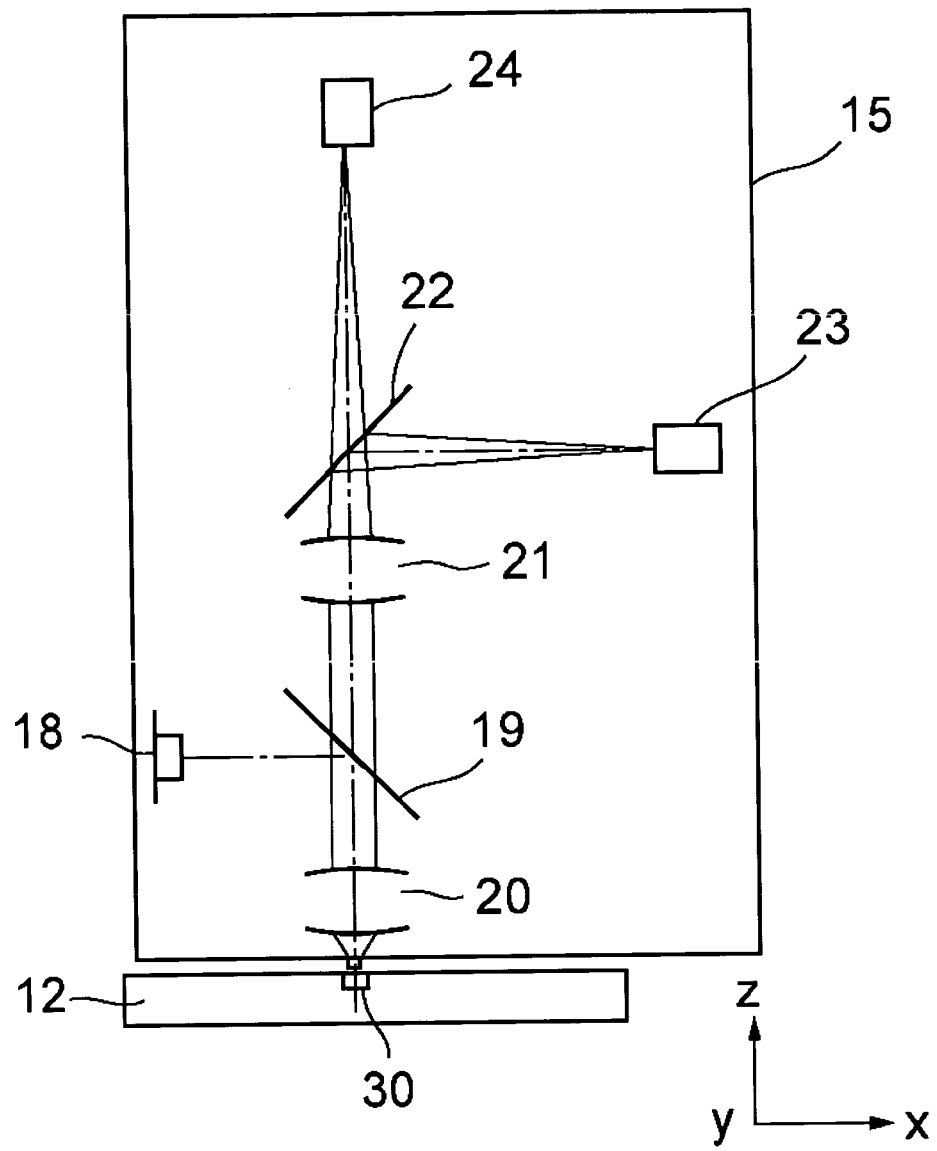
FIG. 2 shows a view of a position detecting optical system of one embodiment.

A description will now be given of a principle of how the alignment detection optical system 15 detects alignment marks. FIG. 2 is a block diagram showing principal elements in the alignment detection optical system 15. In FIG. 2, the illumination light from a light source 18 passes through a lens 20 after reflected on a beam splitter 19, and illuminates an alignment mark 30 on the wafer 12 through a lens 20. The diffracted light from the alignment mark 30 passes through the beam splitter 19 and a lens 21, and is divided by a beam splitter 22, and received by CCD sensors 23 and 24. The CCD sensors 23 and 24 are used to detect positional offsets of the alignment mark 30 in directions X and Y, respectively, and arranged at a rotational angle of 90° relative to the optional axis.

Turning back to a description of FIG. 1 with such a structure of the alignment detection optical system 15, the CCD sensors 23 and 24 feed an image signal as a result of a photoelectric conversion of an optical image of the alignment mark 30 to an alignment signal processor 16. The alignment signal processor 16, in turn, calculates positional information of the alignment mark 30 based on this image signal, and a CPU 17 positions the wafer stage 14 based on the positional information calculated by the alignment signal processor 16 so that a positional offset of the wafer may be corrected.

First Embodiment

A description will now be given of a method of a first embodiment of detecting a position of the alignment mark. As the measurement principle in the direction X is the same as that in the direction Y, a description will now be given of a positional measurement only in the direction X.

Figure 3:
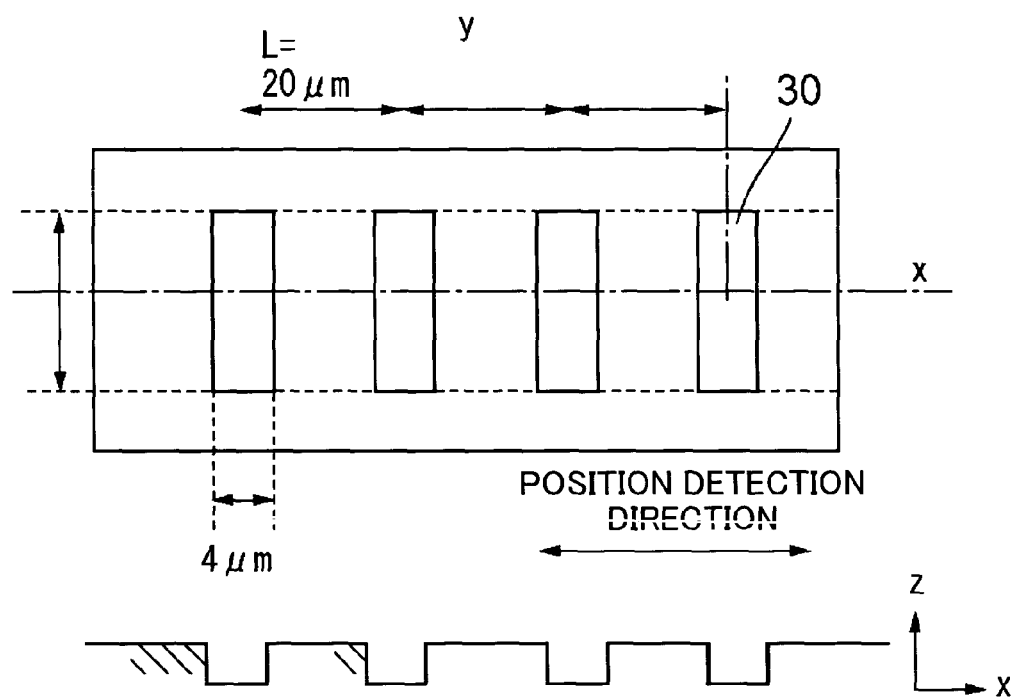
FIG. 3 is a view showing a structure of an alignment mark of one embodiment.

The instant embodiment uses an alignment mark shown in FIG. 3. In FIG. 3, plural strip-shaped alignment marks 30 are arranged at a predetermined interval in the direction X (L=20 μm), each of which has a size of 4 μm in an alignment measurement direction or direction X and 30 μm in a non-measurement direction or direction Y orthogonal to the measurement direction. The mark has a concave section as a result of etching process, and resist (not shown) is applied onto on the mark.

Figure 4:
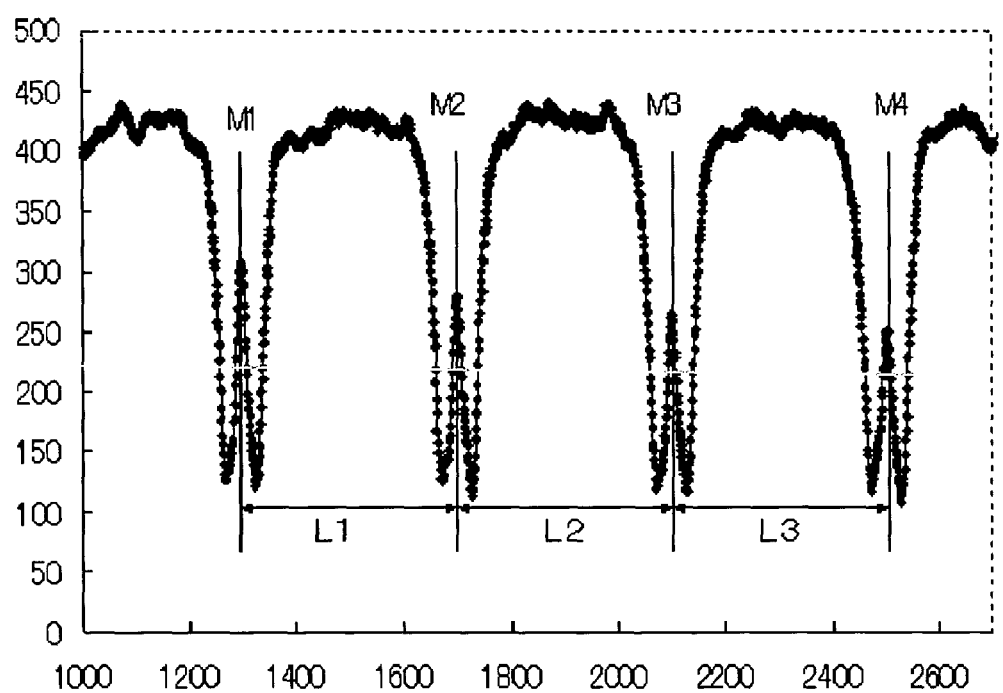
FIG. 4 is an exemplary view showing a mark signal of one embodiment.
Figure 5A:
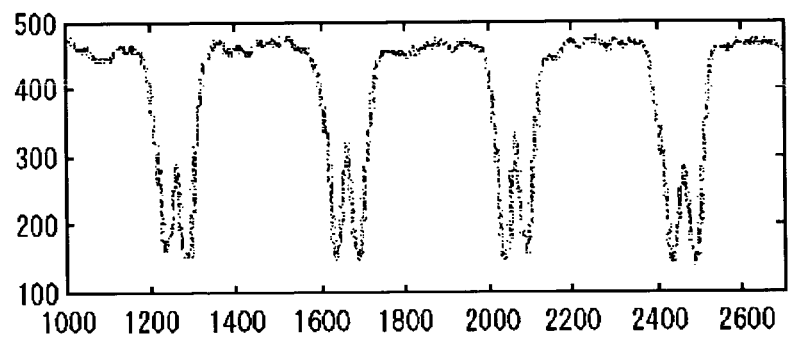
FIG. 5 is a view of a conventional detected signal of a positing detecting mark.
Figure 5B:
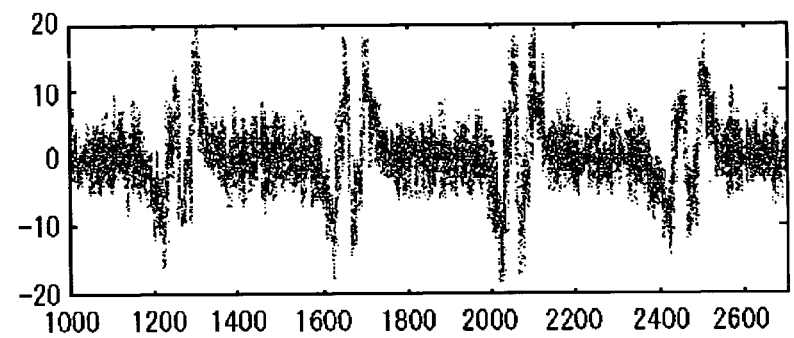
Figure 5C:
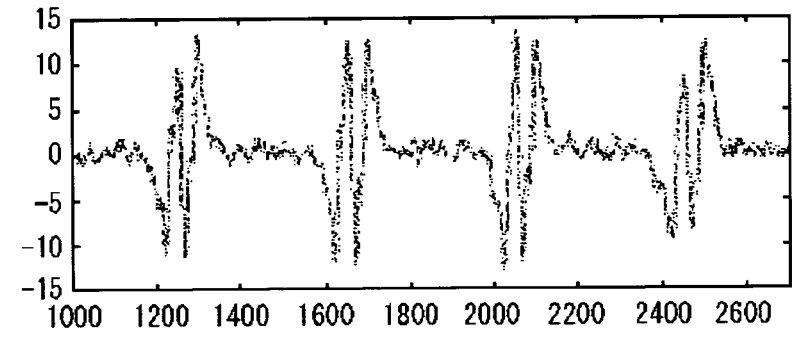

FIG. 4 shows light received by the CCD sensors, which light is reflected from plural alignment marks onto which illumination light is irradiated. Four mark signals shown in FIG. 4 are properly processed so as to detect respective mark positions (M1, M2, M3 and M4 in order from the left in FIG. 4).

The first embodiment uses a method of performing zero phase filtering for a raw signal of the alignment mark, and calculating edges from the filtered waveform. There are some methods of calculating edges from filtered waveform. For example, several points near maximum and minimum positions in a primary differentiation waveform are approximated by a Gauss function, and maximum and minimum positions are calculated with sub-pixel accuracy.

Specifically, the primary differentiation is directed to processing of discrete data Yi or differences to be exact. It is preferable that a differentiated value Yi' of Yi is approximated so as to maintain evaluation points of differentiation as follows:

$$Yi' = \frac{1}{2}(Y_{i+1} - Y_{i-1}) \quad (1)$$

Figure 9:
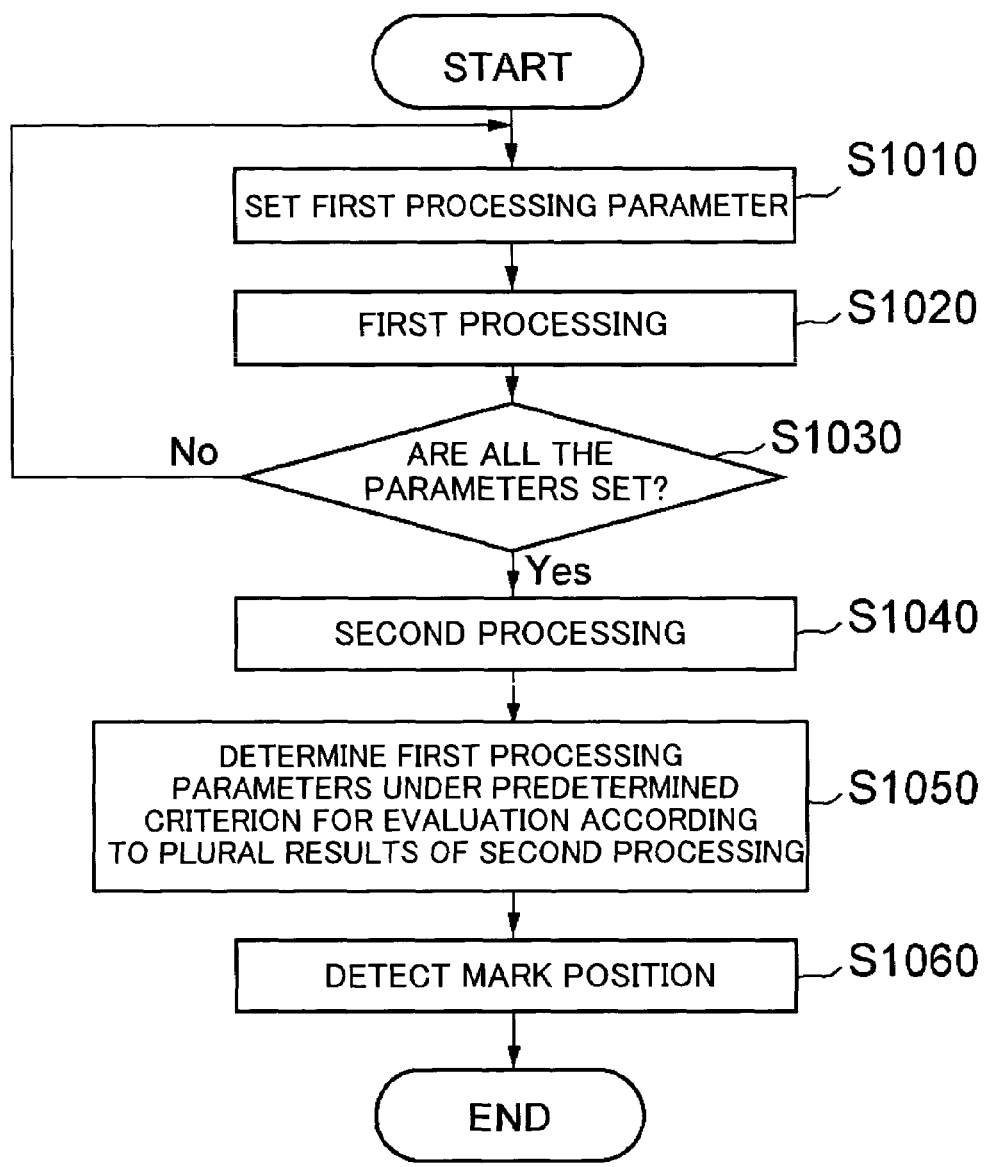
FIG. 9 is a flowchart of a process of the first and second embodiments.

A description will be given of the first embodiment according to a flowchart shown in FIG. 9. First, S1010 sets an order of a zero phase filter to a parameter.

Then, S1020 performs zero phase filtering as a first process. S1030 repeats filtering by varying an order of zero phase filtering.

Next, S1040 calculates plural edges as a second process from the primary differentiation to a filtered waveform. S1050 uses detected plural edges, which have been calculated in S1040, to calculate four mark positions M1, M2, M3 and M4 and their mark intervals L1, L2 and L3. The best parameter is determined based on a result of the mark intervals L1, L2 and L3 calculated for each parameter or order of zero phase filtering set in S1030 according to the following procedure.

Figure 6:
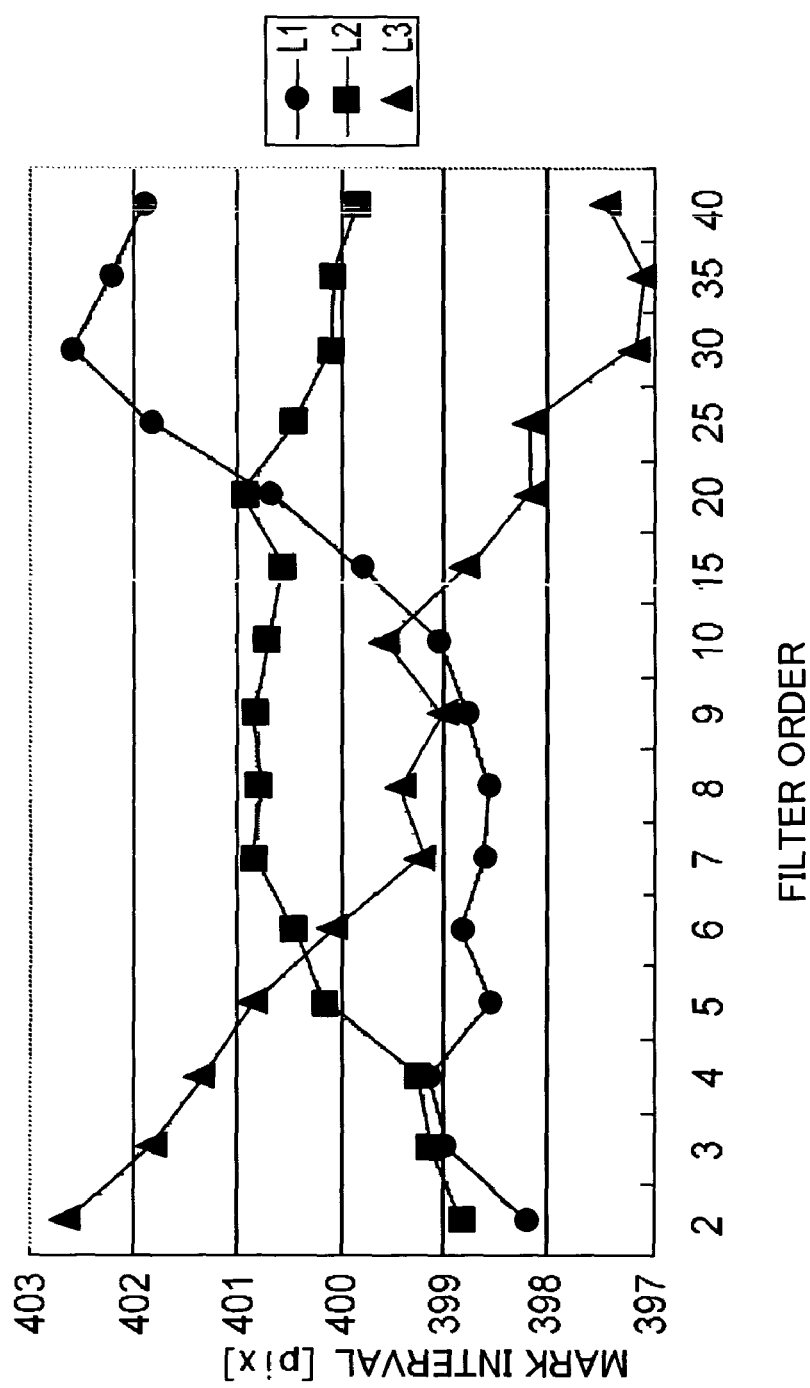
FIG. 6 is a view showing a relationship between an order of zero phase filtering and a mark interval of a first embodiment.

FIG. 6 shows plotted results of the above mark intervals L1, L2 and L3 using orders of zero phase filtering for parameters.

A deviation IND of mark intervals from a design value L as a criterion is defined as in Equation (2) using orders of zero phase filtering for parameters:

$$IND \equiv \sqrt{\frac{(L1-L)^2 + (L2-L)^2 + (L3-L)^2}{3}} \quad (2)$$

Since the first embodiment uses four alignment marks, there are three mark intervals. However, IND is generally defined as Equation (3) when there are N mark intervals:

$$IND \equiv \sqrt{\frac{\sum_{i=1}^{N}(Li-L)^2}{N}} \quad (3)$$

Figure 7:
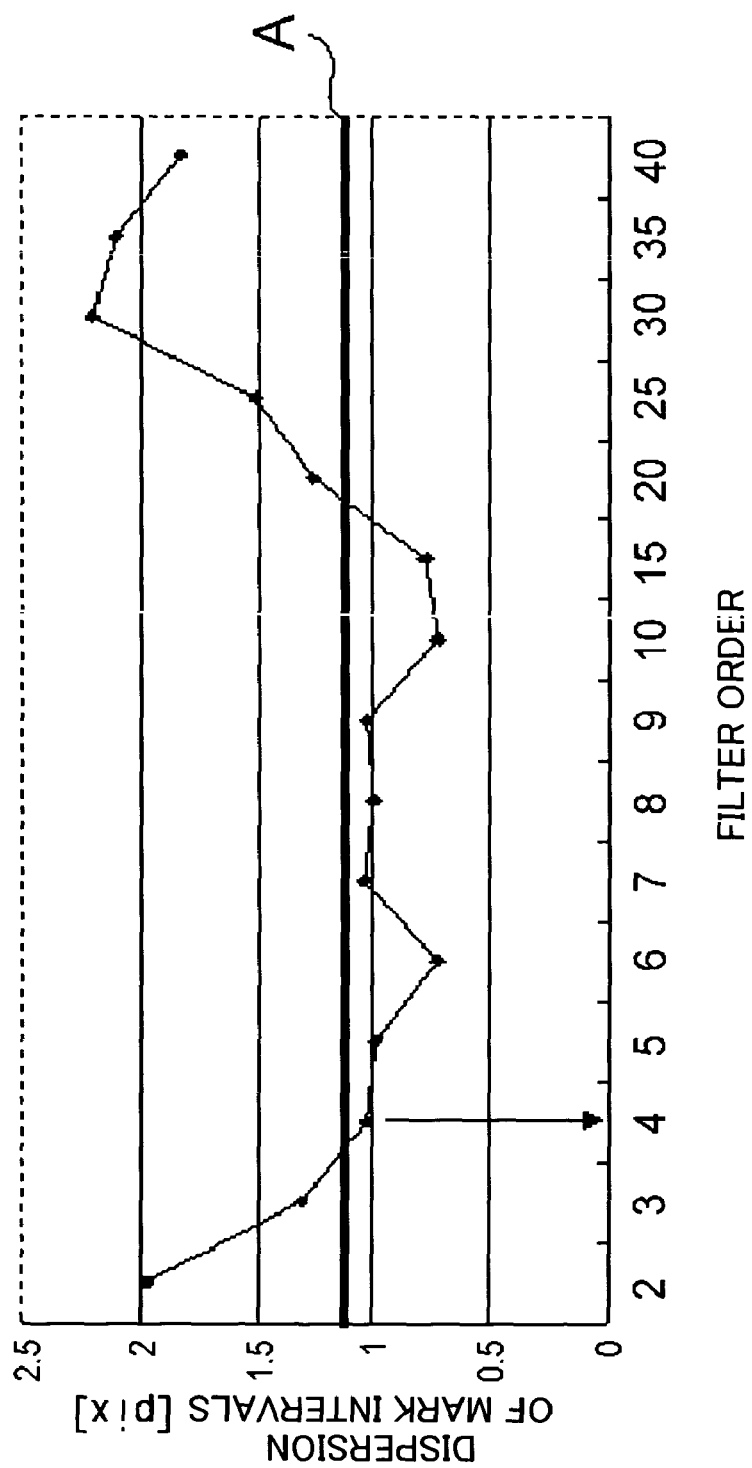
FIG. 7 is a view showing a relationship between an order of zero phase filtering and a deviation of mark intervals of the first embodiment.

FIG. 7 shows plotted deviation of the mark intervals of the first embodiment from a design value using orders of zero phase filtering for parameters. According to FIG. 7, when an order of zero phase filtering increases from a low order to a high order, IND determines a value to be the best parameter below a threshold indicated as "A" in FIG. 7, and adopts a mark position corresponding to the parameter.

In FIG. 7, when the parameter has an excessively high order, the filtered waveform becomes too dull to detect edges accurately, thereby enlarging an offsets of a mark interval from a design value. Therefore, in this case, the lowest order below the threshold is selected as the best parameter, e.g., 4 as an order in FIG. 7.

Viewed from another angle, the present invention selects the smallest one of process parameters or orders below the threshold, minimizing the filtering time within necessary accuracy or the threshold.

Therefore, the alignment may be promptly executed and the throughput may be maintained. S1060 detects mark positions based on the thus-determined best parameter.

Second Embodiment

A description will now be given of a method of a second embodiment of detecting a position of the alignment mark.

The second embodiment uses a method that applies polynomial approximation to a mark raw signal to calculate edges from obtained polynomial. A method for calculating edges from the polynomial may calculate zero cross of a secondary differentiation to the polynomial. It is thus analytical and advantageously more easily calculates a solution than the first embodiment.

When the n-th order polynomial is defined as Equation (4), a zero cross of its secondary differentiation is obtained by solving Equation (5):

$$F(x) = a_n x^n + a_{n-1} x^{n-1} + a_{n-2} x^{n-2} + \ldots + a_0 \quad (4)$$

$$F''(x) = n(n-1)a_n x^{n-2} + (n-1)(n31\ 2)a_{n-1} x^{n-3} + \ldots + 2 \cdot a_2 = 0 \quad (5)$$

A description will be given of the second embodiment according to a flowchart shown in FIG. 9. First, S1010 sets an order of a polynomial to a parameter. Then, S1020 performs polynomial approximation. S1030 repeats polynomial approximations by varying an order of the polynomial.

S1040 calculates plural polynomial edges obtained as a result of approximation from zero crossing of the secondary differentiation. S1050 uses detected edges, which have been detected in S1040, to calculate four mark positions M1, M2, M3 and M4 and their mark intervals L1, L2 and L3. The best parameter is determined based on a deviation of the mark intervals from a design value L as a criterion using an order of a polynomial as a parameter. Step 1060 detects a mark position based on the thus-determined best parameter. The criterion is defined as Equation (2) as in the first embodiment.

Figure 8:
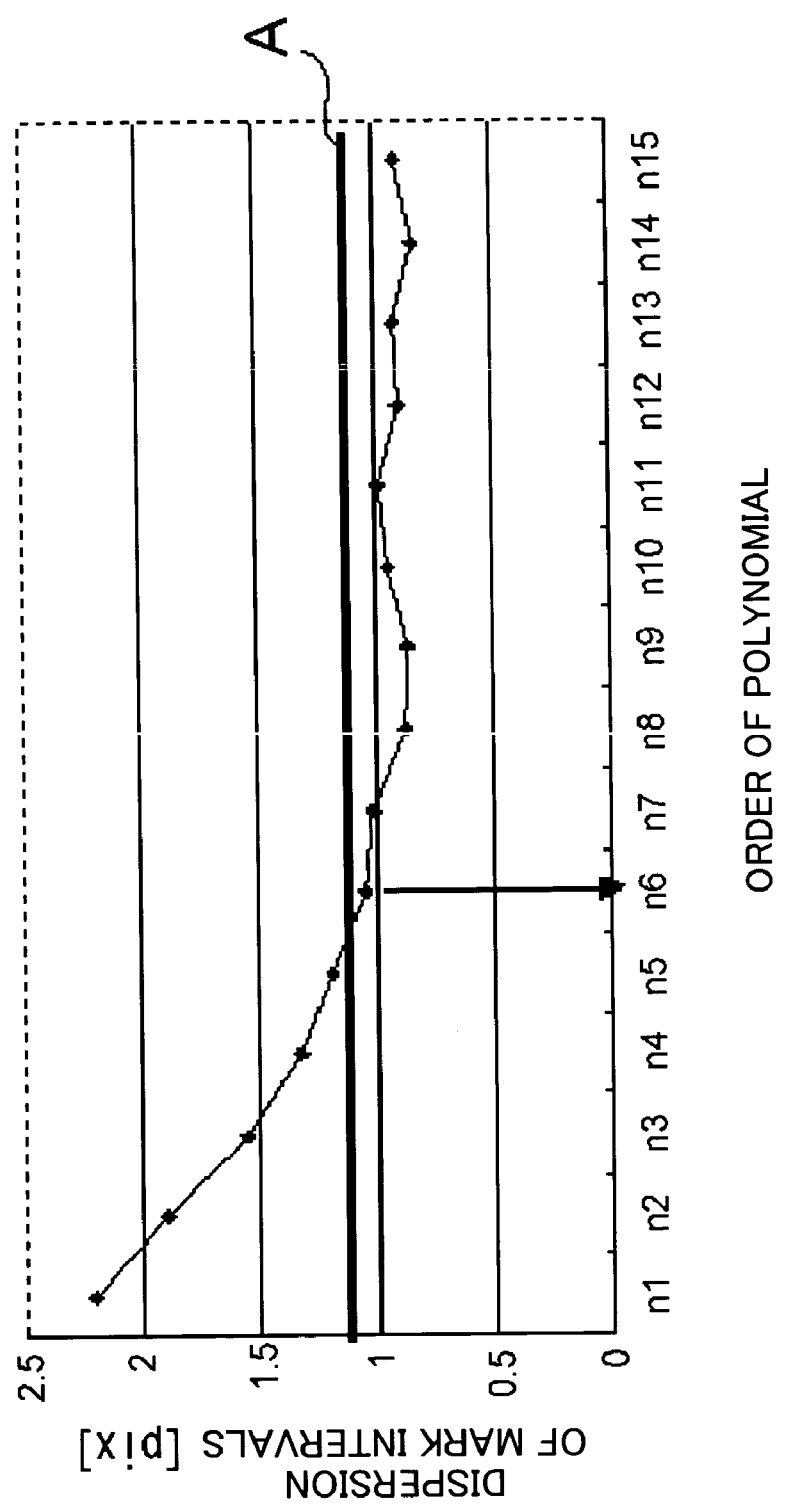
FIG. 8 is a view showing a relationship between an order of zero phase filtering and a deviation of mark intervals of a second embodiment.

FIG. 8 shows a deviation of mark intervals from a design value of the second embodiment.

According to FIG. 8, when an order of a polynomial increases from a low order to a high order, IND determines a value to be the best parameter below a threshold indicated as "A" in FIG. 8, and adopts a mark position corresponding to the parameter, e.g., n6 as an order in FIG. 8.

A description of the design value L of a mark interval described in the first and second embodiments according to the present invention.

It is expected in the future that along with demands for higher precision of alignment, an order of 1 nm, which has been considered negligible, will be brought into question for a threshold of deviation of mark intervals from a design value.

A reticle in this case cannot ignore a mark formation error, and it is effective to expose a reticle that has an alignment mark once, measure an interval of resist images, and store the measured value as a new design value in a table. Both image-processing methods used in the position detecting methods of the first and second embodiments employ image processing in a bright field illumination, and an application is not limited to an exposure apparatus or alignment. For example, the instant embodiment is applicable to a pre-alignment in a high-precision measurement system, such as an overlay detector, CD-SEM, and AFM.

According to the aforementioned position detecting method, a position of a mark may precisely and promptly be detected even when there is a wafer process error WIS due to a defect of a mark, a non-uniform resist application, etc., by optimizing a process parameter according to a criterion in detecting the position of the mark from an alignment mark signal. In particular, an application to alignments for semiconductor exposure apparatuses would reduce influence of a WIS, and improve alignment precision and yield in a semiconductor manufacture process.

Embodiment of Device Fabrication Method

A description will be given of an embodiment of a device fabricating method using the method of the above embodiments.

Figure 10:
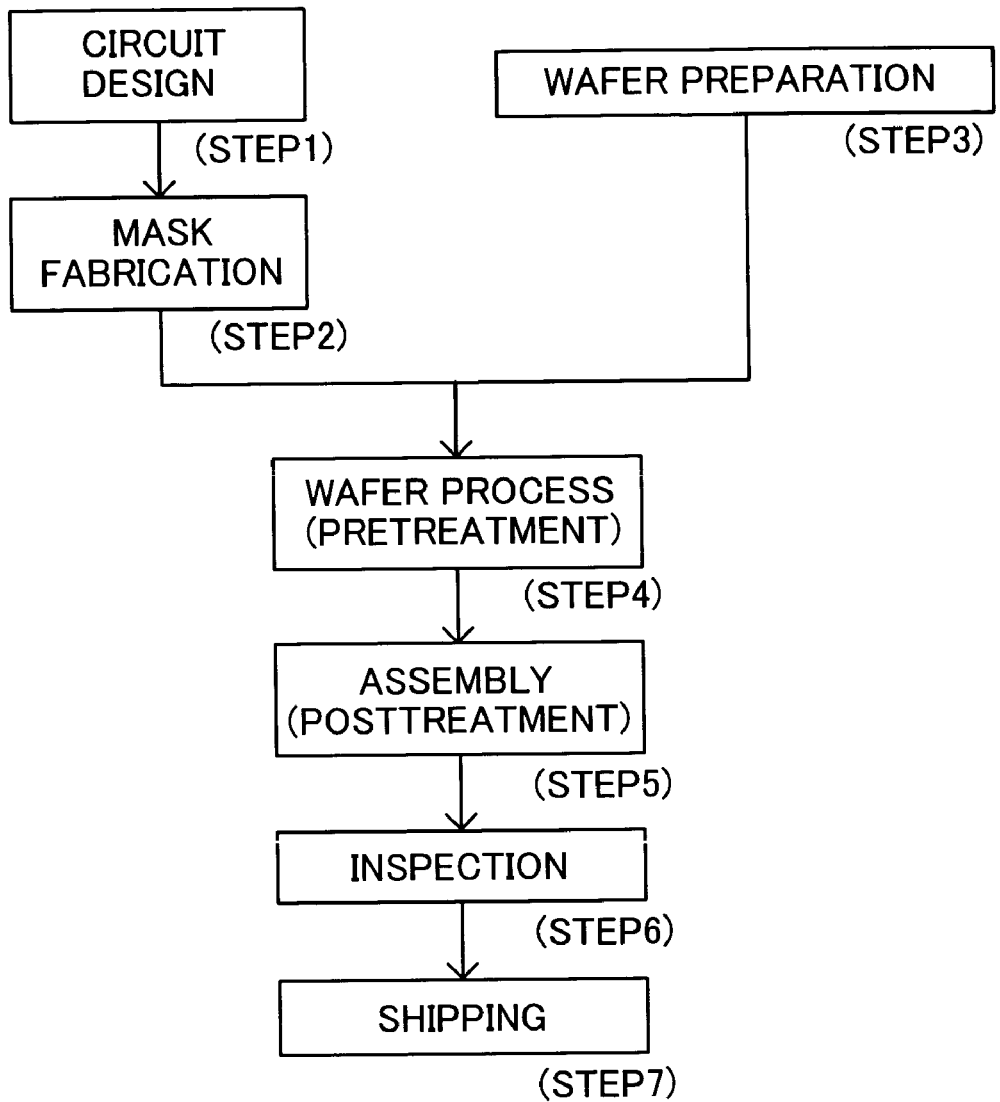
FIG. 10 is a flowchart of a manufacture flow of semiconductor devices.

FIG. 10 is a manufacture flow of fine devices (i.e., semiconductor chips such as IC and LSI, LC panels, CCDs, thin film magnetic heads, micro-machines, etc.). Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 11:
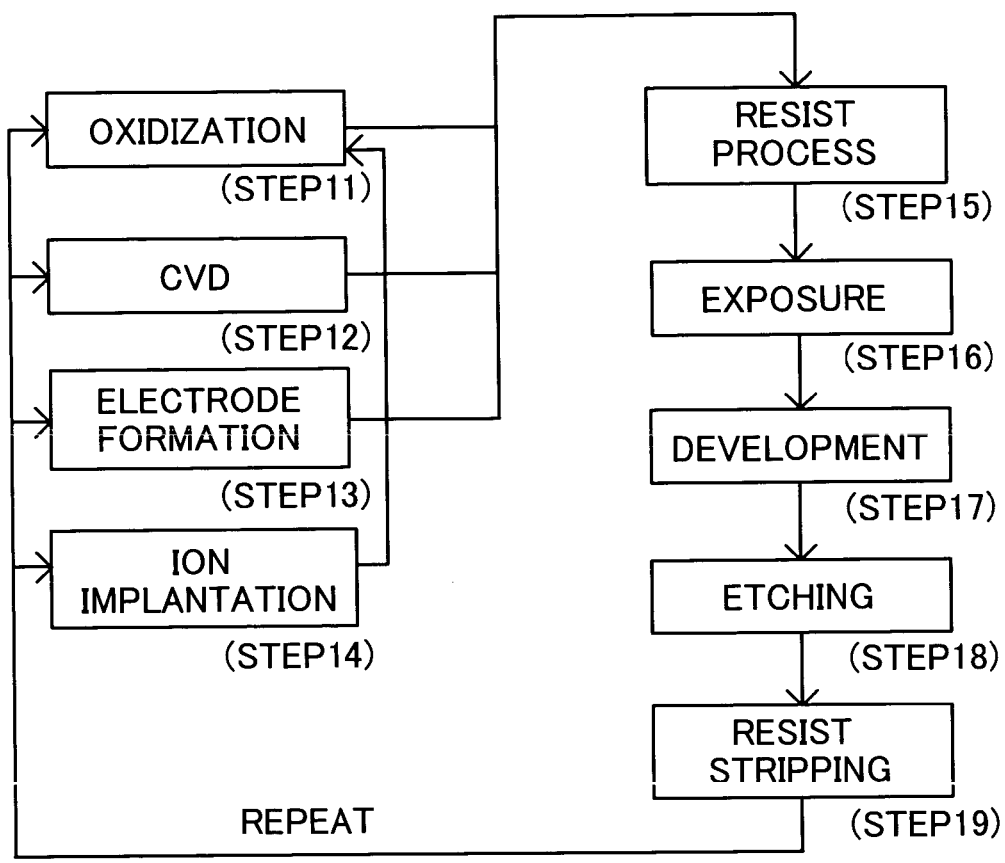
FIG. 11 is a detailed flow of a wafer process.

FIG. 11 is a detailed flow of the wafer process. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the aforementioned exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. Use of the manufacture method of the instant embodiment would manufacture highly integrated semiconductor devices, which have been conventionally hard to be manufactured.

What is claimed is:

1. A position detecting method of detecting a position of a mark formed on an object, said method comprising steps of:

forming an image of the mark on a sensor;

performing a first process that processes an iamge signal obtained by the sensor with respect to each of a plurality of values of a parameter of the first process;

performing a second process that processes a signal obtained by the first process to obtain a feature value with respect to each of the plurality of values of the parameter;

determining a value of the parameter based on feature values obtained by the second process and a reference value defined with respect to the mark; and detecting a position of the mark based on a signal obtained by the first process using the value of the parameter determined in said detennininz step, wherein the first process comprises a process for removing a noise in the image signal.

* * * * *

UNITED STATES PATENT AND TRADEMARK OFFICE
CERTIFICATE OF CORRECTION

PATENT NO. : 7,035,759 B2  Page 1 of 1
APPLICATION NO. : 10/669285
DATED : April 25, 2006
INVENTOR(S) : Oishi et al.

It is certified that error appears in the above-identified patent and that said Letters Patent is hereby corrected as shown below:

In the Specification:

In col. 2, line 13, please replace "0.5$\mu$m" with --0.15 $\mu$m --.

In col. 4, line 56, please replace "optional" with --optical--.

In the Claim:

In claim 1 (col. 8, line 47), please replace "detennininz" with --determining--.

Signed and Sealed this

Tenth Day of April, 2007

JON W. DUDAS
*Director of the United States Patent and Trademark Office*